US006992001B1

(12) United States Patent
Lin

(10) Patent No.: US 6,992,001 B1
(45) Date of Patent: Jan. 31, 2006

(54) SCREEN PRINT UNDER-BUMP METALIZATION (UBM) TO PRODUCE LOW COST FLIP CHIP SUBSTRATE

(75) Inventor: Paul T. Lin, Fremont, CA (US)

(73) Assignee: Kulicke and Soffa Industries, Inc., Willow Grove, PA (US)

( * ) Notice: Subject to any disclaimer, the term of this patent is extended or adjusted under 35 U.S.C. 154(b) by 38 days.

(21) Appl. No.: 10/434,984

(22) Filed: May 8, 2003

(51) Int. Cl.
   *H01L 21/44* (2006.01)

(52) U.S. Cl. ........................ 438/612; 438/613; 257/737; 257/738; 257/781; 257/786

(58) Field of Classification Search ................ 438/108, 438/119, 612–613, 778; 257/737–738, 778–781, 257/786; 361/767
See application file for complete search history.

(56) References Cited

U.S. PATENT DOCUMENTS

| | | | | |
|---|---|---|---|---|
| 5,128,746 | A | * | 7/1992 | Pennisi et al. ............... 257/738 |
| 5,133,989 | A | * | 7/1992 | Numata et al. ............ 427/97.2 |
| 5,242,511 | A | * | 9/1993 | Yokoyama et al. .......... 148/430 |
| 5,492,611 | A | * | 2/1996 | Sugama et al. ........ 204/403.06 |
| 6,028,357 | A | * | 2/2000 | Moriyama ................... 257/737 |
| 6,187,615 | B1 | * | 2/2001 | Kim et al. ................... 438/113 |
| 6,214,636 | B1 | * | 4/2001 | Sawayama et al. ........... 438/57 |
| 6,254,923 | B1 | * | 7/2001 | Boyd et al. ............ 228/180.22 |
| 6,573,161 | B1 | * | 6/2003 | Miyasaka et al. ........... 438/487 |
| 2001/0002068 | A1 | * | 5/2001 | Farnworth et al. .......... 257/737 |
| 2004/0066633 | A1 | * | 4/2004 | Yazaki et al. ................ 361/748 |
| 2004/0082101 | A1 | * | 4/2004 | Honda ........................ 438/106 |
| 2004/0221449 | A1 | * | 11/2004 | Sugawa et al. ............... 29/846 |

\* cited by examiner

*Primary Examiner*—Amir Zarabian
*Assistant Examiner*—Thanh Y. Tran
(74) *Attorney, Agent, or Firm*—Christopher M. Spletzer, Sr.

(57) ABSTRACT

A method for forming an integrated circuit interconnect pad is described. In one embodiment a method of forming an integrated circuit comprises screen printing a conductive paste onto a terminal metalization pad and curing the conductive paste in an inert or reducing atmosphere at an elevated temperature to form an under-bump metalization layer of an interconnect pad. The elevated temperature is below a melting temperature of the terminal metalization pad.

18 Claims, 6 Drawing Sheets

SCREEN PRINT UNDER-BUMP METALIZATION (UBM) TO PRODUCE LOW COST FLIP CHIP SUBSTRATE

BACKGROUND OF THE INVENTION

The present invention relates to integrated circuit fabrication and to the formation of interconnect pads on an integrated circuit device. Specific embodiments of the invention relate to a method for forming an interconnect pad having a screen printed conductive layer. Methods of the present invention are of use in forming a screen printed conductive layer on a variety of integrated circuit metal pads, such as copper, aluminum, and gold pads among others.

The semiconductor industry continues to produce integrated circuits (ICs) of increasing complexity and increasing density. The increased complexity of some of these integrated circuits has in turn resulted in an increased number of interconnect pads on the circuit chips. Each pad can be used for conventional wire bonding or flip chip bonding. At the same time, the increased density of the chips has driven the interconnect pad pitch downward. The combination of these two trends has been a significant increase in the interconnect pad density needed to connect the chips to printed wiring board substrates that interface with external devices and/or interconnect the chips to other integrated circuit devices.

Integrated circuit interconnect pads are typically formed in multi-step processes in which one or more metal layers, commonly referred to as under-bump metalization layers, are sputtered onto an underlying terminal metalization pad. Sputtering is a relatively costly process that includes numerous process steps that are carried out in a vacuum processing chamber. FIGS. 1, 2, 3, 4, 5, 6, and 7 show a typical time ordered sequence of steps of a typical method for forming a solder ball 195 and an under-bump metalization layer 140 (or simply under-bump metalization) on a terminal metalization pad 115 of an integrated circuit 100. Under-bump metalization 140 in combination with terminal metalization pad 115 form an interconnect pad 120 of the integrated circuit 100. Metal layer 110 is deposited on terminal metalization pad 115 and passivation layer 125 via sputtering or other process as shown in FIG. 1. The sputtered metal may include titanium, nickel-vanadium, copper, or other metals. Unwanted portions 135 of metal layer 110 are removed (see FIG. 2), for example, by wet or dry etching. To etch portions 135, a photoresist layer 140 is formed over metal layer 110. The photoresist layer is then exposed and developed to reveal portions 135, which are then etched resulting in the structure shown in FIG. 3. The remaining photoresist is subsequently removed to expose the remaining portion of the metal layer, referred to as under-bump metalization 140. The under-bump metalization and terminal metalization pad form an interconnect pad 120 through which the integrated circuit is electrically coupled to an integrated circuit package (not shown) and/or other integrated circuits (not shown). Subsequent to forming interconnect pad 120, a seed layer 150 is formed over passivation layer 125 and under-bump metalization 140, FIG. 4. A mask 160 is formed over the seed layer 150 and a solder paste layer 165 is then electroplated onto the seed layer, FIG. 5. Mask 160 is subsequently removed (see FIG. 6) and solder paste layer 165 is then reflowed to form solder bump 195 (see FIG. 7). Because of the relatively large number of process steps used to form interconnect pad 120, and because the process steps tend to be costly, for example, because some are carried out in a vacuum processing chamber, the process of forming interconnect pads is relatively costly and increases the price of the resultant integrated circuit die. Moreover, the numerous processing steps also tend to make integrated circuit fabrication times relatively long.

Accordingly, the semiconductor industry continues to strive to reduce the number of steps used to form integrated circuit interconnect pads and to reduce the duration and cost of the steps.

BRIEF SUMMARY OF THE INVENTION

The present invention pertains to a method of forming an integrated circuit and specifically to the formation of interconnect pads on the integrated circuit. Embodiments of the present invention provide a method of screen printing layers of an interconnect pad that does not engender the problems described above. Embodiments of the invention provide for relatively fewer processing steps to form the interconnect pad and the steps are relatively less costly than known methods. Accordingly, embodiments of the present invention may be characterized as lowering the production time of integrated circuits while at the same time reducing the cost of production.

According to one embodiment of the invention, a method is provided for forming an integrated circuit including, screen printing a conductive paste onto a terminal metalization pad; and curing the conductive paste in an inert or reducing atmosphere at an elevated temperature to form an under-bump metalization layer of an interconnect pad; wherein the elevated temperature is below a melting temperature of the terminal metalization pad.

In some embodiments the screen printing step includes the conductive paste being screen printed onto a portion of a passivation layer overlying a peripheral portion of the terminal metalization pad. In one embodiment the terminal metalization pad is copper, gold, or aluminum. In another embodiment, the curing step includes irradiating the conductive paste with pulsed laser light or continuous wavelength laser light to heat the conductive paste to the elevated temperature. In yet another embodiment the method further includes removing metal oxide from the terminal metalization pad prior to the screen printing step. In yet another embodiment the method further includes screen printing solder paste on the interconnect pad; and reflowing the solder paste at a reflow temperature to form a solder bump. In yet another embodiment the conductive paste includes copper particles suspended in a low melting point glass.

According to another embodiment of the invention, a method is provided for forming an integrated circuit including, screen printing a conductive paste onto a terminal metalization pad and sintering the conductive paste in an inert or reducing atmosphere at a temperature to form an under-bump metalization layer of an interconnect pad and sinter the conductive paste to the terminal metalization pad. In some embodiments the sintering step includes raising the integrated circuit to the sintering temperature in a sintering oven. In one embodiment the sintering step includes raising the integrated circuit to the sintering temperature with pulsed laser light or continuous wavelength laser light. In another embodiment the screen printing step includes the conductive paste being screen printed onto a portion of a passivation layer overlying a peripheral portion of the terminal metalization pad. In yet another embodiment the method further includes screen printing solder paste on the interconnect pad; and reflowing the solder paste at a reflow temperature to form a solder bump. In yet another embodiment the conductive paste includes copper particles suspended in a low melting point glass.

A further understanding of the nature and advantages of the present invention may be realized by reference to the remaining portions of the specification and the drawings.

DETAILED DESCRIPTION OF THE INVENTION

Embodiments of the present invention are directed toward methods for forming a conductive layer of an interconnect pad on an integrated circuit using screen printing techniques. Unlike known techniques, such as sputtering techniques, the method of the present invention does not engender the problems of sputtering, such as relatively high cost and lengthy processing times.

Screen printing techniques have been widely used in the graphic arts fields to produce art work and have found use in the production of printed circuit boards to transfer relatively large scale mask patterns onto printed circuit boards. Screen printing techniques include the use of a stencil to selectively transfer an image onto a substrate. The image is typically transferred by mechanically pressing a given material through porous (e.g., mesh) portions of the stencil onto a substrate while adjacent non-porous portions of the stencil do not permit printing of the material. Screen printed materials of use in the production of graphic art work include paints and/or inks, while materials of use in the transfer of mask patterns in circuit board production include masking materials. Stencils for use in screen printing are often created by laser milling an image onto a stencil or by photo development processes wherein an image is photo transferred to an undeveloped stencil and the stencil is subsequently developed to reveal the image. An undeveloped stencil typically includes a screen that is coated with a non-porous material. Upon development, portions of the non-porous material are removed yielding porous section of the stencil or yielding apertures in the stencil in the configuration of a photo transferred image. As the image is in effect transferred to the developed stencil, the stencil is then of use to transfer the same image to a substrate as discussed above. The techniques of screen printing and the use of stencils in such printing are well known and therefore, will not be discussed in any greater detail.

Figure 1:
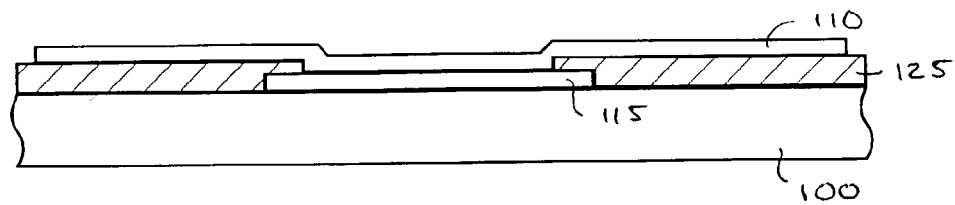
FIGS. 1, 2, 3, 4, 5, 6, and 7 show a time ordered sequence of steps for forming a metal layer on a terminal metalization pad to form an integrated circuit interconnect pad.
Figure 2:
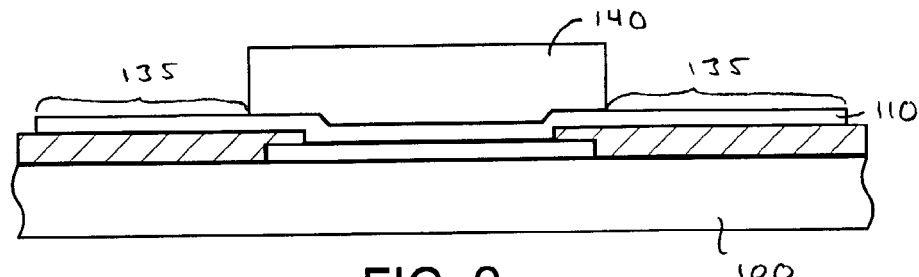
Figure 3:
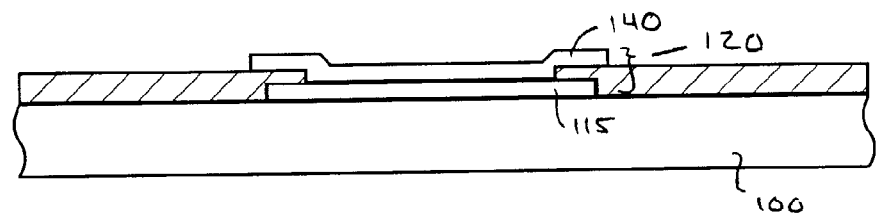
Figure 4:
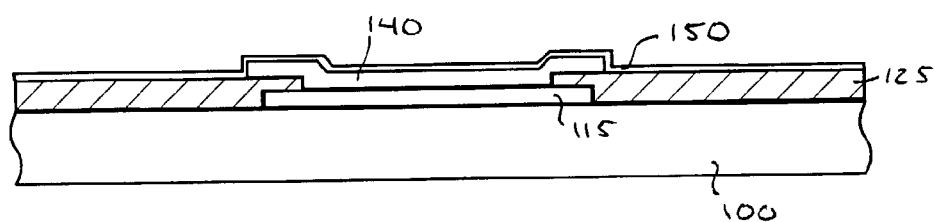
Figure 5:
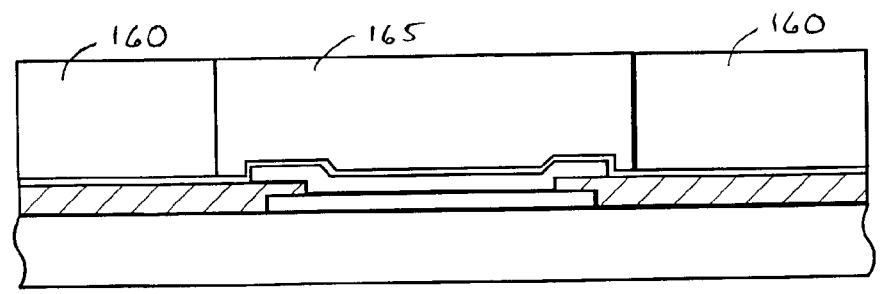
Figure 6:
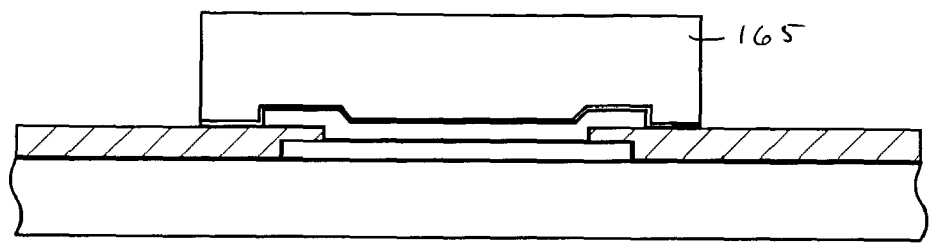
Figure 7:
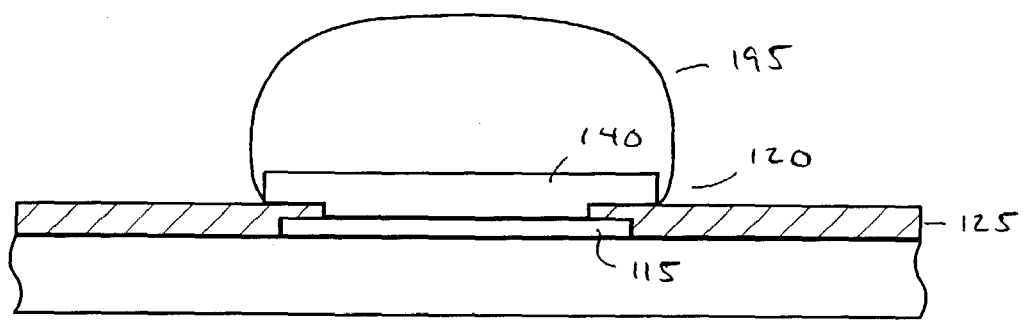
Figure 8:
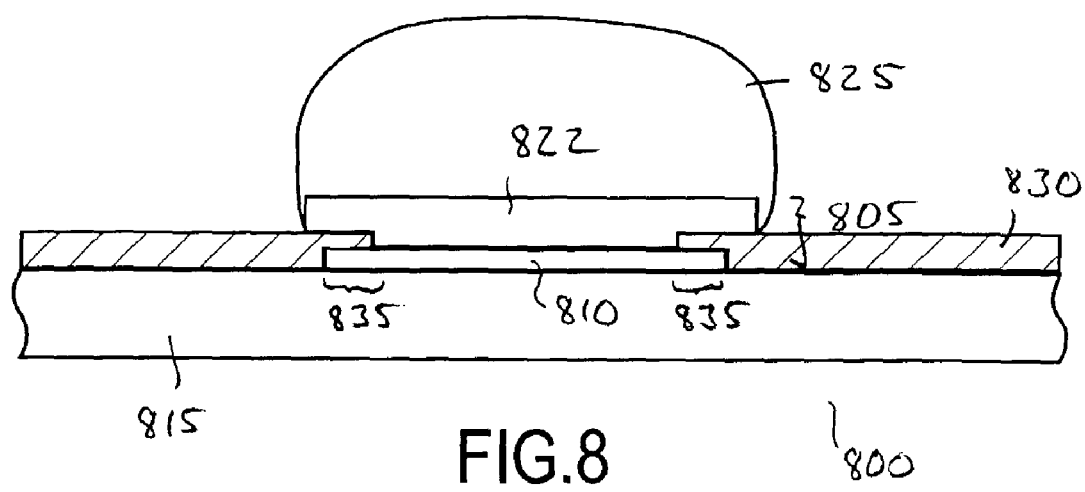
FIG. 8 shows a cross-sectional view of a portion of an integrated circuit having an interconnect pad according to an embodiment of the present invention.

FIG. 8 shows a cross-sectional view of a portion of an integrated circuit 800 having an interconnect pad 805 according to an embodiment of the present invention. Interconnect pad 805 includes a terminal metalization pad 810 that is coupled to underlying circuitry 815. Under-bump metalization 822 is coupled to terminal metalization pad 810. Terminal metalization pad 810 may be a variety of metal types commonly used for integrated circuit metal traces and interconnect pads, such as aluminum, copper, gold, alloys of these metals, silicides, or other conductive materials. The under-bump metalization 822 is a conductive layer that is conductively coupled to the terminal metalization pad 810 and forms the top layer of the interconnect pad. Under-bump metalization 822 is configured to receive a solder bump 825 that is formed, for example, by applying a solder paste via a screen printing process to the under-bump metalization and then reflowing the solder paste to form the solder bump. Alternatively, the under-bump metalization may be wave soldered, or a solder ball, such as flip chip ball, may be deposited onto the under-bump metalization and reflowed to form a solder bump or solder ball, respectively.

According to some embodiments, a passivation layer 830 is disposed to overlie circuitry 815 and is disposed between peripheral portions 835 of the terminal metalization pad 810 and under-bump metalization 822. The passivation layer provides a hermetic seal to prevent corrosion of integrated circuit components 815 and provides a hard coating to protect the integrated circuit components from becoming scratched or smudged. The passivation layer may be silicon dioxide, polyimide, or other passivation material. The use of passivation layers for the above mentioned purposes is well known in the art and will not be discussed in further detail.

Figure 9:
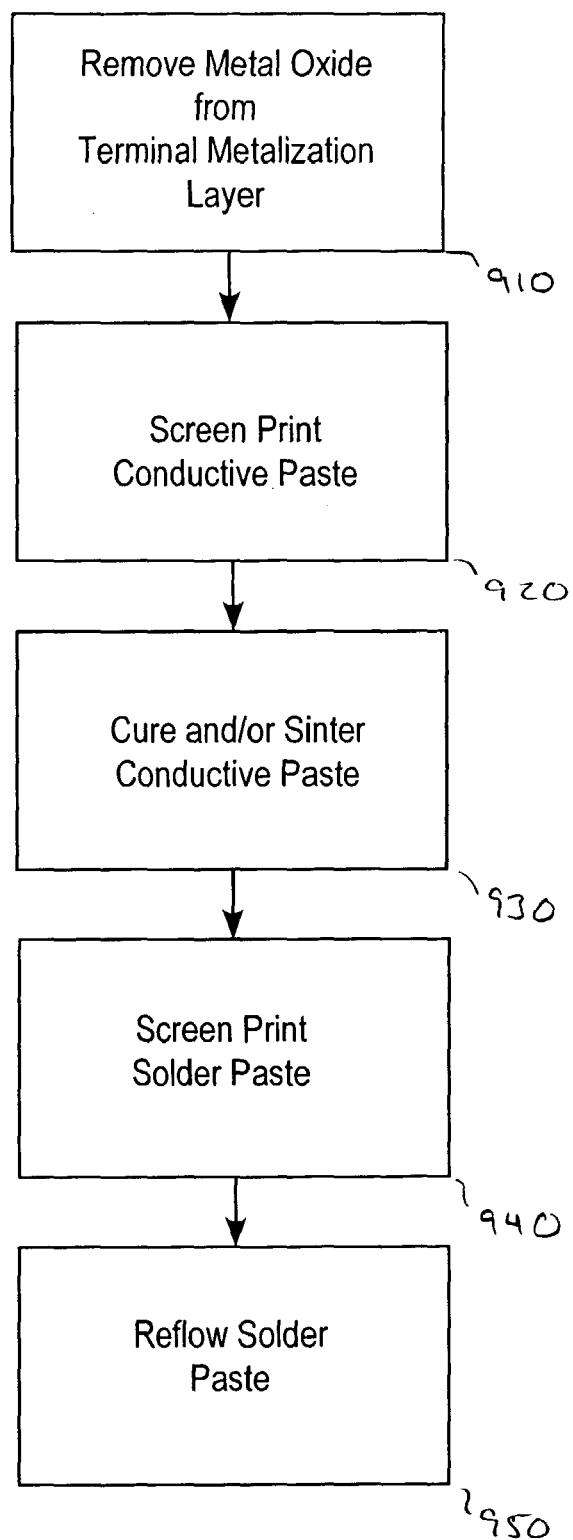
FIG. 9 shows a high-level flow chart for a method of forming an interconnect pad having an under-bump metalization layer formed on a terminal metalization pad according to an embodiment of the present invention.
Figure 10:
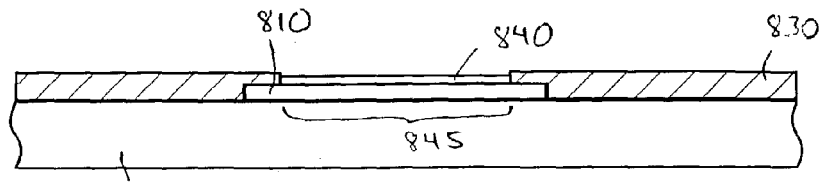
FIG. 10 shows a cross-sectional view of a portion of an integrated circuit having an oxide layer formed on a exposed portion of a terminal metalization pad.
Figure 11:
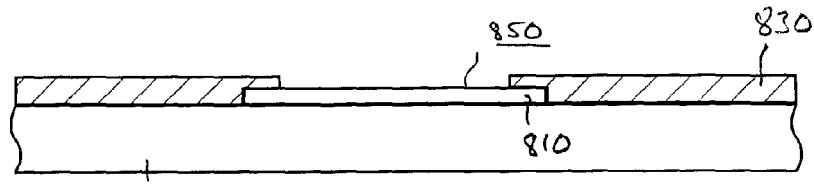
FIG. 11 shows a cross-sectional view of a portion of an integrated circuit having a terminal metalization pad cleaned of the oxide layer.
Figure 12:
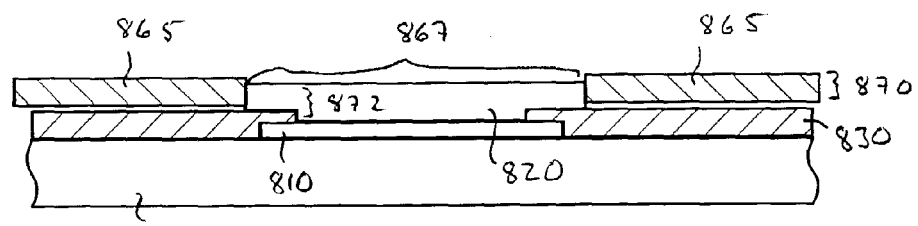
FIG. 12 shows a cross-sectional view of a portion of a stencil used for screen printing a metal paste onto portions of the terminal metalization pad and portions of the passivation layer.
Figure 13:
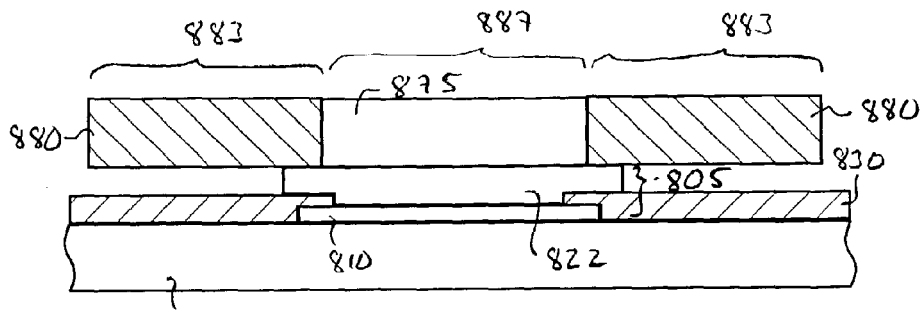
FIG. 13 shows a cross-sectional view of a portion of a stencil used for screen printing a solder paste onto portions of the under-bump metalization layer.
Figure 14:
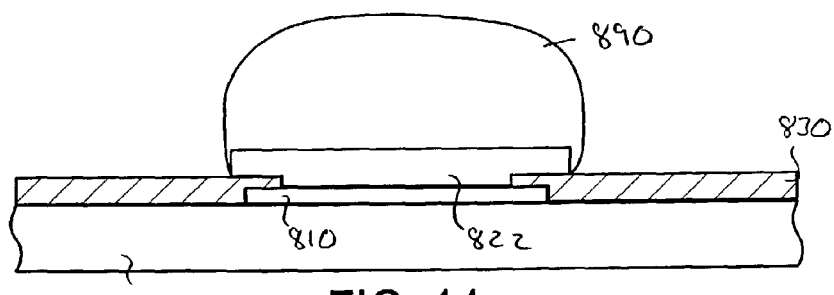
FIG. 14 shows a cross-sectional view of a solder bump formed on the under-bump metalization subsequent to reflow.

FIG. 9 shows a high-level flow chart for a method of forming an interconnect pad having under-bump metalization formed on the terminal metalization pad according to an embodiment of the present invention. Various steps of the method shown in FIG. 9 will be described in combination with FIGS. 10–14 to add clarity to the present discussion. The same numeral scheme used for elements shown in FIG. 8 will be used for the same or similar elements shown in FIGS. 10–14. In the diagrams, terminal metalization pad 810 has already been deposited and suitably passivated at the start of the process. According to step 910, an oxide layer 840 that has formed on an exposed portion 845 of metal layer 810 (FIG. 10) is removed to provide a cleaned surface 850, FIG. 11. Removing the oxide layer from terminal metalization pad 810 provides that layers subsequently formed on pad 810 will have relatively higher adherence and better conductivity than if the metal oxide layer were not removed. Metal oxide layer 840 may be removed from the terminal metalization pad by various chemical processes, such as wet or dry etch techniques, or by ablation processes, such as a focused ion beam techniques or laser ablation techniques. After such cleaning of any metal oxides from pad 810, a conductive paste 820 is screen printed onto the terminal metalization pad and onto portions of the passivation layer 830, step 920. FIG. 12 shows a cross-sectional view of a stencil 860 having a solid section 865 (also referred to herein as a non-porous section) and a porous screen section 867 (or alternatively an aperture section without a screen section). During the printing step, the solid section 865 of the stencil prevents the printing of the conductive paste onto select portions of dielectric layer 830 and the porous section 867 permits the printing of the paste onto pad 810 and other select portions of dielectric layer 830. During the printing step, the conductive paste may be mechanically pressed through the porous section of the stencil by a variety of techniques, such as squeegeeing the conductive paste or rolling the conductive paste with a roller.

According to some embodiments, stencils of different thicknesses 870 are used to print conductive pastes of corresponding different thicknesses 872. A relatively thickly printed conductive paste may be screen printed with a relatively thick stencil to increase the standoff of a solder ball reflowed onto conductive paste 820. Relatively large standoff is of use, for example, when a underfill resin (not shown) is to be inserted between the integrated circuit 800 and an integrated circuit package (not shown) to which the integrated circuit is soldered. Relatively thin conductive paste layers may be screen printed with a relatively thin stencil. Relatively thin conductive paste layers are of use, for example, on integrated circuit having relatively fine interconnect pad pitch. Typical thicknesses 872 of screen printed conductive paste 820 are about 5–15 microns, however, other thicknesses are of use.

According to embodiments of the present intention, conductive paste 820 includes at least one metal species in relatively small particulate form suspended in a paste medium. Metals of use include copper, aluminum, palladium, gold, alloys of these metals, or other useful metals. For example, useful copper alloys include copper-titanium, copper-beryllium, copper-magnesium, copper-tin and other copper alloys. As referred to herein, metals, such as copper, include alloys of the metals. Those of skill in the art will know of other useful metal species that may be included in conductive paste 820. According to one embodiment the metal species in the conductive paste is the same as the metal species of the terminal metalization pad 810. Screen printing a conductive paste having the same metal species as that of pad 810 not only increases adhesion between the conductive paste and pad 810, but also reduces the possibility of delamination. Moreover, the thermal coefficients of expansion (TCE) can be relatively closely matched reducing thermal stress in the layers of interconnect pad 805 to be formed.

The paste medium in which the particulate metal is suspended may include a variety of solvents, binders, wetting agents, and/or fluxes to control the viscosity of the paste and to increase adhesion of the paste to the passivation layer 830 and the terminal metalization pad 810. According to one embodiment the paste includes a low melting point glass into which metal particles, such as copper, are suspended. Low melting point glasses of use have melting points in the range of about 127° C.–349° C. and may contain one or a combination of selenium, arsenic, thallium, sulfur, or other chemicals that lower the melting temperature of glass. The use of low melting point glass provides for relatively high adhesion of the conductive paste to a passivation layer 830 formed of silicon oxide or the like upon curing, (curing step 930 is discussed below). Moreover, low melting point glass also forms a hermetic seal over the terminal metalization pad preventing corrosion of the pad. The metal paste includes one or a combination of an organic binder, liquid carrier, or polymer in which metal particles, such as copper, are suspended. Organic binders of use include those having soldering flux and a solvent, which maintains the metal paste at a desired viscosity. According to one embodiment, the polymer is polyimide, which provides for relatively high adhesion via thermal copolymerization with a passivation layer 830 formed of polyimide or other similar polymers upon curing, (curing step 930 is discussed below). According to one embodiment, the conductive paste screen printed onto terminal metalization pad 810 is NCP-2000™ manufactured by JAPAN REC Co., LTD of Osaka Japan.

Subsequent to screen printing conductive paste 820, the conductive paste is cured and/or sintered at an elevated temperature, step 930. Subsequent to curing and/or sintering, the metal paste 820 is referred to as the under-bump metalization layer (or simply under-bump metalization) and is given a new reference number 822. Curing and/or sintering, among other things, increases the adhesion of the conductive paste to the passivation layer and the terminal metalization pad and transforms the paste into the relatively rigid under-bump metalization layer 822. For example, curing of a conductive paste having copper suspended in polyimide is of use to adhere the conductive paste to a polyimide passivation layer by thermally copolymerizing the polyimide monomers of the conductive paste and passivation layer. Moreover, copolymerizing the polyimide monomers transform the monomers into relatively long polymers chain that are relatively rigid. Once the polyimide is copolymerized the long polymer chains may be cross linked by various cross linking techniques. Sintering, as compared with curing, increases the adhesion of the metal particles suspended in the conductive paste to the underlying terminal metalization pad 810. For example, sintering of a conductive paste having copper particles is of use to adhere the copper particles to a terminal metalization pad formed of copper. The conductive paste is cured and/or sintered at temperatures below the melting point of terminal metalization pad 810 and below the critical annealing temperature. The critical annealing temperature is that at which the flat-band voltage threshold of underlying circuitry 815 begins to shift. The flat-band voltage threshold is the temperature at which the gate voltage of transistors in circuitry 815 begin to shift from known design levels to less desired levels. According to one embodiment, conductive paste having aluminum particles is sintered at about 300° C. or less. The sintering temperature of a conductive paste having copper or palladium will be higher than a conductive paste having aluminum.

According to one embodiment, if the terminal metalization pad is aluminum, the pad may be optionally coated, such as by plating, to enhance electrical contact with the metal particles in the conductive paste. This may be desired due to difficulties in removing aluminum oxide formed on the exposed portion of pad 810 and the reoxidation of the aluminum once oxide layer 840 has been removed. Useful materials for coating aluminum include, zinc, electroless nickel, and/or electroless gold.

According to one embodiment, curing and/or sintering of the conductive paste is performed in a sintering oven or belt driven furnace, such as a solder wave machine. Sintering ovens, as are well known in the art, provide relatively uniform heating of semiconductor wafers in a chemically controllable atmosphere. According to an alternate embodiment, the conductive paste is cured and/or sintered by irradiating the metal paste with laser light, which raises the temperature of the conductive paste to a curing and/or sintering temperature. The laser light may be either pulsed laser light or continuous wavelength laser light. Lasers of use include, for example, tunable lasers, such as tunable die lasers or tunable excimer lasers, that can be tuned to the absorption frequency of a given conductive paste. According to one embodiment, curing and/or sintering is performed in a inert or reducing gas atmosphere. The use of a reducing gas limits the amount of oxidation of the terminal metalization pad and the metal in the conductive paste when the temperatures of pad 810 and conductive paste 820 are raised to the curing and/or sintering temperature.

Figure 15:
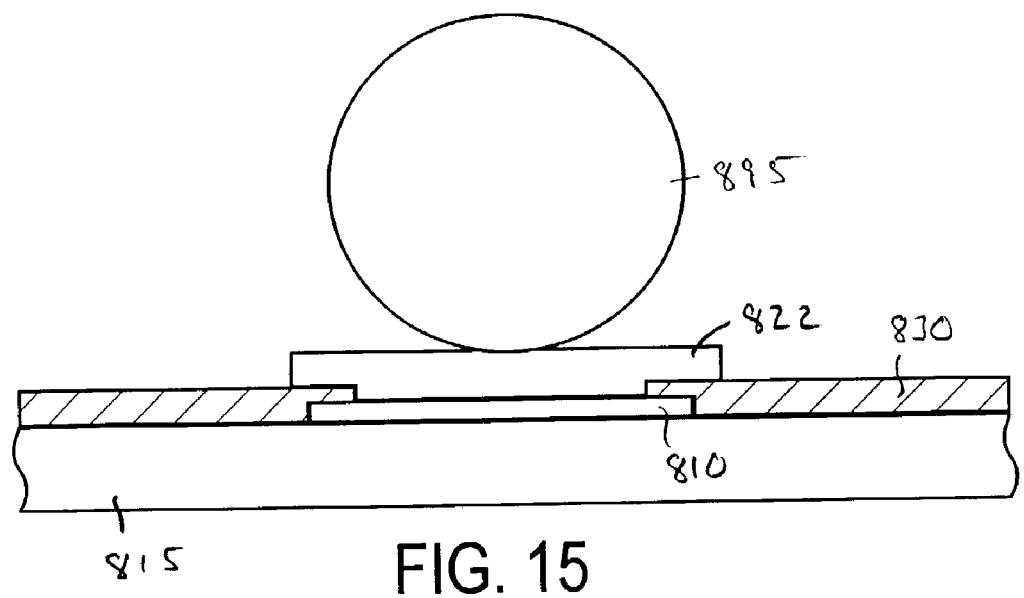
FIG. 15 shows a cross-sectional view of a solder ball, such as a flip chip ball, disposed on the under-bump metalization subsequent to reflow.
Figure 16:
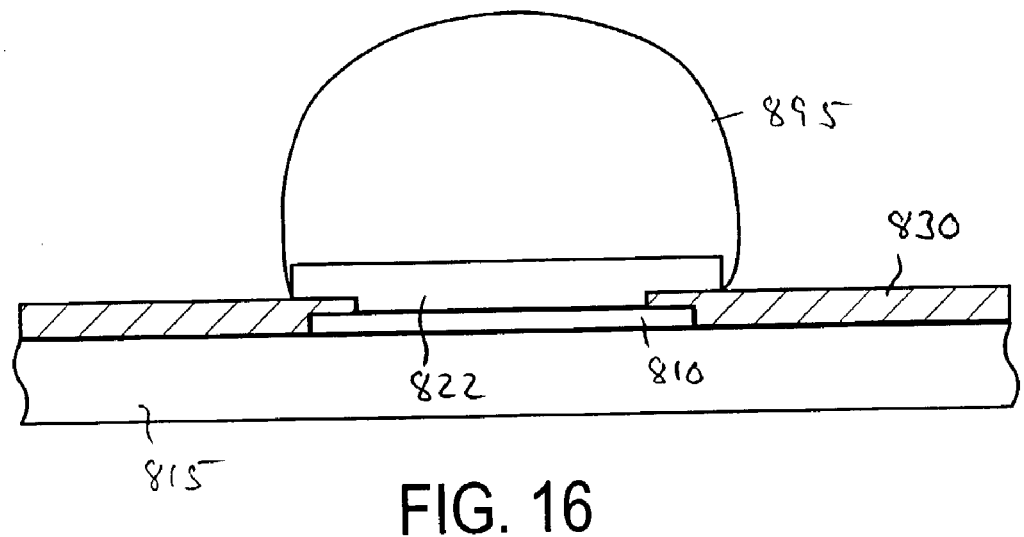
FIG. 16 shows a cross-sectional view of a reflowed solder ball disposed on the under-bump metalization.

Subsequent to curing and/or sintering the conductive paste, the resultant under-bump metalization 822 is coated with a layer of solder paste 875, step 940. According to one embodiment, the solder paste is screen printed onto the under-bump metalization in a manner similar to that discussed above for the conductive paste. For example, a stencil 880 having appropriately positioned non-porous portion 883 and porous screen portion 887 (or aperture portion) is positioned so that the printed solder paste 875 overlies the under-bump metalization 822, FIG. 13. The solder paste is then reflowed at an appropriate reflow temperature to form a solder bump 890, FIG. 14, step 950. As an alternative to screen printing a solder paste onto under-bump metalization 822, the under-bump metalization may be soldered in a wave solder machine to form solder bump 890. The use of wave solder machines are well known in the art and will not be discussed in detail. According to another embodiment, solder paste 875 is sprayed onto under-bump metalization 822, for example, by a solder jet head (similar to an inkjet head). According to yet another embodiment, a solder ball 895, such as flip chip ball, is placed on under-bump metalization 822 subsequent to curing and/or sintering the under-bump metalization, see FIG. 15. After placement, solder ball 895 is reflowed to adhere the solder ball to the under-bump metalization, see FIG. 16.

It is to be understood that the above description is intended to be illustrative and not restrictive. Many alternate and equivalent embodiments of the present invention will be apparent to those of skill in the art upon reviewing the above description. By way of example, the invention described herein has been illustrated as being used to screen print conductive paste on a terminal metalization pad of an integrated circuit chip, alternatively a conductive paste may be screen printed onto the interconnect pads of a chip package, such as a laminate substrate, a printed circuit board, or a printed circuit board having thin-film build up layers. Alternatively, both integrated circuit terminal metalization pads and laminated substrate interconnect pads may be screen printed with conductive pastes described herein to facilitate ease of flip chip solder attachment of die to package. Each of these equivalents and alternate embodiments are considered to be within the scope of the present invention. Therefore, the scope of the invention should not be limited by the above description, but instead should be determined with reference to the following claims, along with the full scope of the equivalents to which such claims are entitled.

What is claimed is:

1. A method of processing an integrated circuit comprising the steps of:
   removing a metal oxide from a terminal metallization pad of the integrated circuit;
   screen printing a conductive paste onto the terminal metallization pad of the integrated circuit;
   curing the conductive paste in an inert or reducing atmosphere at an elevated temperature while the conductive paste is in conductive contact with the terminal metallization pad to form an under-bump metalization layer of an interconnect pad, the interconnect pad including the terminal metallization pad and the under-bump metalization layer; wherein the elevated temperature is below a melting temperature of the terminal metalization pad;
   applying a solder material on the interconnect pad; and
   reflowing the solder material at a reflow temperature to form a solder bump.

2. The method of claim 1 wherein the screen printing step includes the conductive paste being screen printed onto a portion of a passivation layer overlying a peripheral portion of the terminal metallization pad.

3. The method of claim 2 wherein the terminal metalization pad is copper, gold, or aluminum.

4. The method of claim 1 wherein the elevated temperature is below a critical annealing temperature of the integrated circuit.

5. The method of claim 1 wherein the curing step includes curing the conductive paste in a sintering oven.

6. The method of claim 1 wherein the curing step includes irradiating the conductive paste with pulsed laser light or continuous wavelength laser light to heat the conductive paste to the elevated temperature.

7. The method of claim 1 wherein the applying step includes
   screen printing solder paste on the interconnect pad, and the reflowing step includes
   reflowing the solder paste at the reflow temperature to form the solder bump.

8. The method of claim 1 wherein the applying step includes
   solder jet printing solder paste on the interconnect pad, and the reflowing step includes
   reflowing the solder paste at the reflow temperature to form the solder bump.

9. The method of claim 1 wherein the applying step includes
   placing a solder ball on the interconnect pad, and the reflowing step includes
   reflowing the solder ball at the reflow temperature to form the solder bump.

10. The method of claim 9 wherein the solder ball is a flip chip ball.

11. The method of claim 1 wherein the conductive paste includes copper particles suspended in a low melting point glass.

12. The method of claim 11 wherein the low melting point glass is in a granular form.

13. The method of claim 1 wherein the conductive paste includes copper particles suspended in at least one of an organic binder, liquid carrier or polyimide.

14. The method of claim 1 wherein the conductive paste includes copper, palladium, or gold.

15. The method of claim 1 wherein the conductive paste includes at least one member of a group including a solvent, a binder, a wetting agent, and a flux.

16. The method of claim 1 wherein the under-bump metallization layer is solder wettable.

17. The method of claim 1 wherein the elevated temperature is below 300° C.

18. The method of claim 1 wherein the elevated temperature is a sintering temperature.

* * * * *